(12) United States Patent
Liu et al.

(10) Patent No.: US 6,608,382 B2
(45) Date of Patent: Aug. 19, 2003

(54) METAL BUMP

(75) Inventors: I-Ming Liu, Hsinchu (TW); Chin-Chen Yang, Hsinchu Hsien (TW); Hong-Shiung Chen, Hsinchu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 09/859,573

(22) Filed: May 17, 2001

(65) Prior Publication Data

US 2002/0109227 A1 Aug. 15, 2002

(30) Foreign Application Priority Data

Feb. 15, 2001 (TW) ........................................ 90103389 A

(51) Int. Cl.[7] ............................ H01L 23/48; H01L 29/40
(52) U.S. Cl. .................... 257/737; 257/773; 257/778; 257/779; 257/782; 257/783; 257/786
(58) Field of Search ................................ 257/737, 773, 257/778, 779, 782, 783, 784, 786, 688, 694, 698, 738; 156/182; 494/13; 228/110.1; 438/106

(56) References Cited

U.S. PATENT DOCUMENTS

| | | | | |
|---|---|---|---|---|
| 3,716,907 A | * | 2/1973 | Anderson | 228/110.1 |
| 4,512,758 A | * | 4/1985 | Wedemeyer et al. | 494/13 |
| 5,329,423 A | * | 7/1994 | Scholz | 174/263 |
| 5,426,849 A | * | 6/1995 | Kimbara et al. | 156/182 |
| 5,949,142 A | * | 9/1999 | Otsuka | 257/703 |
| 6,100,112 A | * | 8/2000 | Amano et al. | 438/106 |
| 6,208,027 B1 | * | 3/2001 | King et al. | 257/737 |

* cited by examiner

*Primary Examiner*—Minh Loan Tran
*Assistant Examiner*—Tan Tran
(74) *Attorney, Agent, or Firm*—Darby & Darby

(57) ABSTRACT

A plurality of metal bumps connecting a nonconducting substrate and a chip, consisting of: at least a first metal bump having at least one curved face, at least a second metal bump having at least one curved face, and at least a third metal bump having at least a first curved face and a second curved face. The three centers of these first three metal bumps form a triangle, in that the first curved face of the third metal bump is adjacent to the curved face of the first metal bump, and the second curved face of the third metal bump is adjacent to the curved face of the second metal bump.

10 Claims, 8 Drawing Sheets

METAL BUMP

BACKGROUND OF THE INVENTION

1. Field of the Invention

The present invention relates in general to a metal bump. In particular, the present invention relates to a profile-design rule of a metal bump for reducing a diagonal distance between two adjacent metal bumps positioned at adjacent rows.

2. Description of the Related Art

The attachment of a bared die to a glass panel (called COG: chip on glass) is one advanced application for electrically connecting integrated circuits (ICs) achieving lighter weight, smaller size, lower cost and less power consumption demanded in various display products. The quality and reliability of the liquid crystal display (LCD) module depends on the way in which the driver IC is attached to the glass panel. Anisotropic conductive film (ACF) is the most popular material for attaching the chip to the glass panel. ACF is an adhesive film consisting of dispersed, microscopic, electrically conductive particles 3–15 μm in diameter and an insulating adhesive film 15–35 μm thick. Various kinds of conductive particles, such as carbon fiber, metal (Ni, solder), and metal (Ni/Au)-coated plastic balls have been proposed, and the uniformity of the conductive particles distribution is considered an influence on the electrical property and reliability of ACF. Also, various types of adhesive materials, such as thermoplastic, thermosetting, and mixed thermoplastic and thermosetting materials have been proposed. In general, ACF is classified into two types. One has conductive particles 5 μm in diameter covered with a very thin insulating layer, wherein the thin insulating layer is broken when the particles are deformed, the bared conductive particles serving as a bridge for electrically connecting the metal bump on the chip and the bonding pad on the glass panel. However, the breaking of the conductive particles during the fabricating process cannot be ensured; therefore, there is no guarantee of effective contact between the metal bump and the bonding pad. The other type of ACF is a double-layer type, which consists of one layer filled with conductive particles 3 μm in diameter and the other layer with no conductive particles, so that the functions of conduction and adhesion are separated. This can ensure the effective contact between the metal bump and the bonding pad. Nevertheless, when too many conductive particles exist in the space between two adjacent metal bumps, a lateral connection between the two adjacent metal bumps is easily formed, resulting in an electrical short.

FIG. 1A to FIG. 1C are schematic cross-sectional diagrams of a method of connecting a chip 14 and a glass substrate 10 according to the prior art. The glass substrate 10 of the LCD module comprises a first area for disposing an array of thin film transistors (TFTs), a second area for disposing data IC chips or scan IC chips 14, and a plurality of bonding pads 12 are formed on the second areas. The chip 14 has a plurality of metal pads 16 and a plurality of metal bumps 18, wherein each metal bump 18 is patterned on each metal pad 16 and corresponds in position to each bonding pad 12. In the prior method of connecting the chip 14 and the glass substrate 10, as shown in FIG. 1A, an ACF 20 is attached to the surface of the glass substrate 10 to cover the bonding pad 12. Then, the surface of the chip 14 is downwardly placed on the predetermined area of the glass substrate 10, wherein each metal bump 18 corresponds to each bonding pad 12 of the glass substrate 10. As shown in FIG. 1B, by means of the adhesion of the ACF 20 and the downwardly exerted pressure, the chip 14 is tightly attached to the glass substrate 10. Next, a thermal process is performed to cure the ACF 20. The conductive particles 22 sandwiched between the top of the metal bump 18 and the surface of the bonding pad 12 now serve as an electrically connecting bridge, as shown in FIG. 1C. However, the distribution of the conductive particles 22 cannot be controlled in processing, and thereby many conductive particles 22 that exist between adjacent metal bumps 18 may laterally connect with each other to cause electrical shorts.

FIG. 2A shows a top view of the layout of the metal bumps 18 according to the prior art. For providing great output terminals and avoiding electrical shorts between metal bumps 18, the metal bumps 18 are generally arranged in two rows. In each row, each metal bump 18 with a transverse width $W_2$ is spaced out a transverse distance $W_1$ apart from each other, and the tops of the metal bumps 18 are leveled off. For example, in a first row, a first metal bump 181 and a second metal bump 182 are adjacent and apart from the transverse distance $W_1$. In a second row, a third metal bump 183 is disposed between the first metal bump 181 and the second bump 182. Therefore, the three centers of the three bumps 181, 182, 183 respectively are arranged as a triangle. Notice that the transverse distance $W_1$ is equal to the transverse width $W_2$, and a lengthwise distance L between the first row and the second row is smaller than the transverse distance $W_1$. However, since the metal bump 18 is shaped into a square or rectangular profile, the shortest distance is found between a point A of the first metal bump 181 and a point B of the third metal bump 183. A lateral connection between the first metal bump 181 and the third metal bump 183 is easily formed by the conductive particles to result in an electrical short. Similarly, a lateral connection is easily formed between a point C of the second metal bump 182 and a point D of the third metal bump 183.

In addition, an electrical short is easily caused by an alignment error between the metal bump 18 and the bonding pad 12. Please refer to FIG. 2B, which shows a top view of the metal bump 18 and the bonding pad 12 according to the prior art. In general, the profile of the bonding pad 12 is square or rectangular according to the profile of the metal bump 18, and the surface area of the bonding pad 12 is larger than the top area of the metal bump 18. Thereby, a tolerance limitation of an alignment error in COG technique depends on the shorted distance d between the first bonding pad 121 and the third bonding pad 123. When the chip 14 is inaccurately attached to the glass substrate 10, the up-left corner or the up-right corner of the third bonding pad 123 is easily contacted with the point A of the first metal bump 181 or the point C of the second metal bump 182. Similarly, the down-right corner of the first bonding pad 121 or the down-left corner of the second bonding pad 122 is easily contacted with the point B or D of the third metal bump 183.

From the above-described disadvantages, the square or rectangular profile of the metal bump 18 reduces the diagonal distance between two adjacent metal bumps 18 positioned at adjacent rows. This causes electrical shorts and limits the tolerance of alignment error in COG technique, resulting in lowering quality and reliability of LCD modules.

SUMMARY OF THE INVENTION

An object of the present invention is to provide a cylindrical bump to increase the diagonal distance between metal bumps positioned in adjacent rows.

Another object of the present invention is to provide a polygonal bump to increase the diagonal distance between metal bumps positioned in adjacent rows.

The metal bumps of the present invention include at least a first metal bump having at least one curved face, at least a second metal bump having at least one curved face, and at least a third metal bump having at least a first curved face and a second curved face. The three centers of the first metal bump, the second metal bump and the third metal bump are arranged as a triangle. The first curved face of the third metal bump is adjacent to the curved face of the first metal bump. The second curved face of the third metal bump is adjacent to the curved face of the second metal bump.

Another embodiment of the present invention includes at least a first metal bump having at least one faceted face, at least a second metal bump having at least one faceted face, and at least a third metal bump having at least a first faceted face and a second faceted face. The three centers of the first metal bump, the second metal bump and the third metal bump are arranged as a triangle. The first faceted face of the third metal bump is adjacent to the faceted face of the first metal bump. The second faceted face of the third metal bump is adjacent to the faceted face of the second metal bump.

It is an advantage of the present invention that these metal bumps avoid a lateral electrical connection, thus improving the tolerance limitation of alignment errors in COG technique.

This and other objective of the present invention will no doubt become obvious to those of ordinary skill in the art after having read the following detailed description of the preferred embodiments which are illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1A:
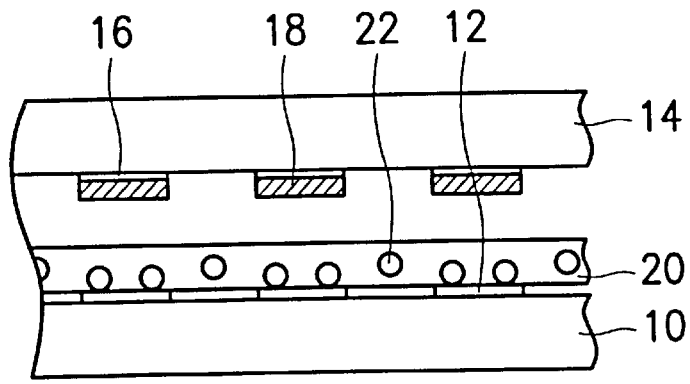
FIG. 1A to FIG. 1C are schematic cross-sectional diagrams of a method of connecting the chip and the glass substrate according to the prior art.
Figure 1B:
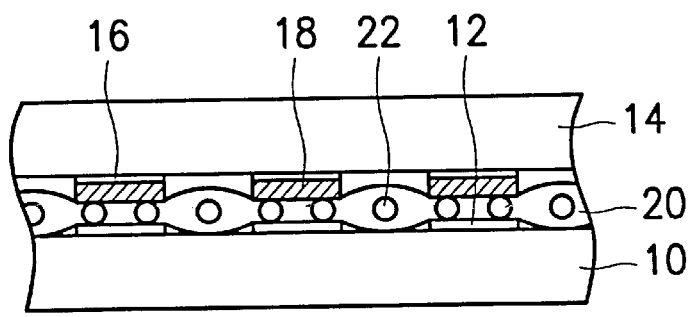
Figure 1C:
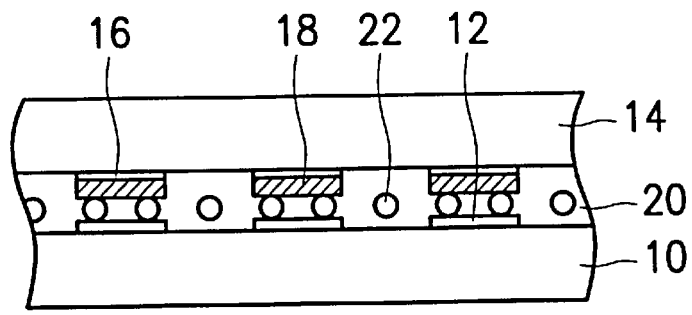
Figure 2A:
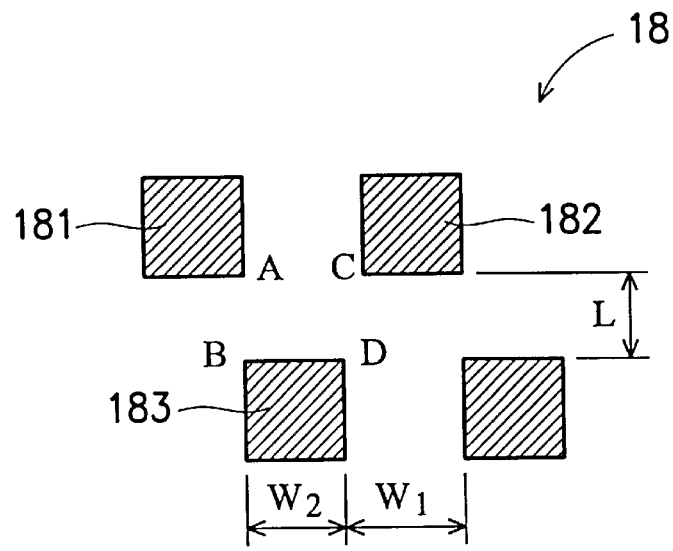
FIG. 2A shows a top view of the layout of the metal bumps according to the prior art.
Figure 2B:
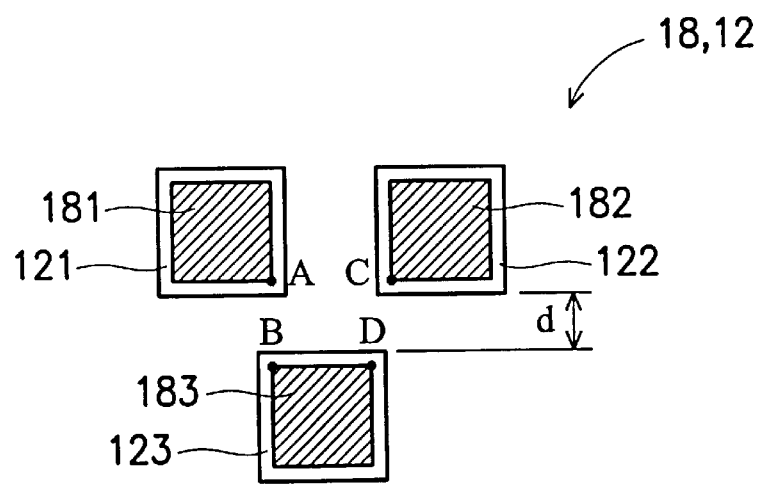
FIG. 2B shows a top view of the metal bump 18 and the bonding pad according to the prior art.

A plurality of metal bumps is based on a corresponding plurality of metal pads on a chip. By means of COG technique and the adhesion of the ACF, the chip can be lowered and tightly attached to a plurality of bonding pads of a glass substrate. Therefore, the conductive particles of the ACF sandwiched between the top of the metal bump and the surface of the bonding pad serve as an electrically connecting bridge for electrically connecting the chip and the glass substrate. In order to avoid electrical shorts between adjacent metal bumps, the right-angled points of the square or rectangular profile are rounded or cut into curved faces or faceted faces, wherein the contact area of the metal bump should be kept at the maximum receivable range to maintain the demanded conductivity. This can increase the diagonal distance between adjacent metal bumps positioned at adjacent rows. Furthermore, a preferred arrangement in which three centers of three adjacent metal bumps positioned at two adjacent rows are arranged as an equilateral triangle can increase layout density of the metal bumps and is applied to a chip of smaller scale.

[First Embodiment]

FIGS. 3A to 3E are top views of metal bumps according to the first embodiment of the present invention. A plurality of metal bumps 30 is arranged in two adjacent rows. In each row, each metal bump 30 with a transverse width $W_2$ is situated a transverse distance $W_1$ from all others, and the tops of the metal bumps 30 are leveled off. Notice that the transverse distance $W_1$ is equal to the transverse width $W_2$, and a lengthwise distance L between the two adjacent rows is smaller than the transverse distance $W_1$. In a first row, a first metal bump 301 and a second metal bump 302 are adjacent and apart from the transverse distance $W_1$. In a second row, a third metal bump 303 is disposed between the first metal bump 301 and the second bump 302. Therefore, the connection between the three centers of the three metal bumps 301, 302, 303 becomes a triangle.

Figure 3A:
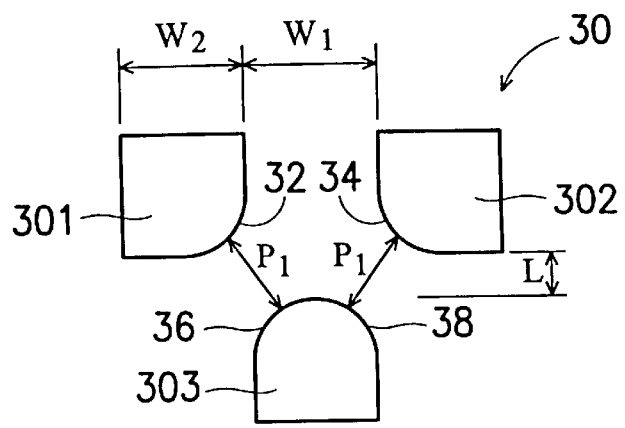
FIGS. 3A to 3E are top views of metal bumps according to the first embodiment of the present invention.

As shown in FIG. 3A, the first metal bump 301 has at least one curved face 32, the second metal bump 302 has at least one curved face 34, and the third metal bump 303 at least has a first curved face 36 and a second curved face 38. The first curved face 36 of the third metal bump 303 is adjacent to the curved face 32 of the first metal bump 301, and the second curved face 38 of the third metal bump 303 is adjacent to the curved face 34 of the second metal bump 302.

Figure 3B:
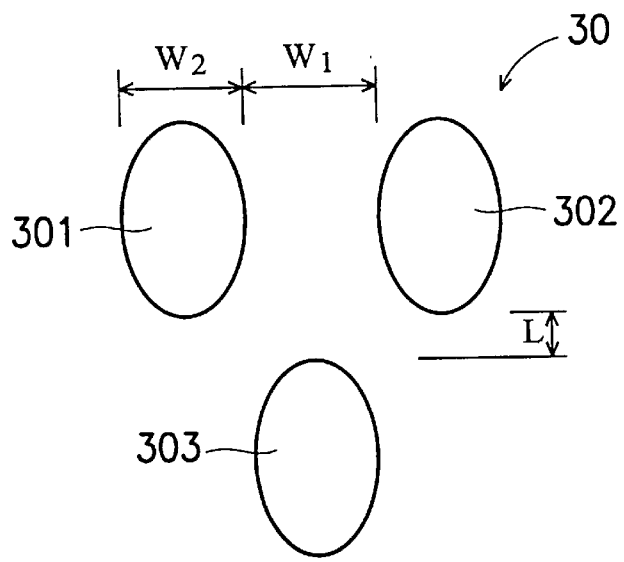
Figure 3C:
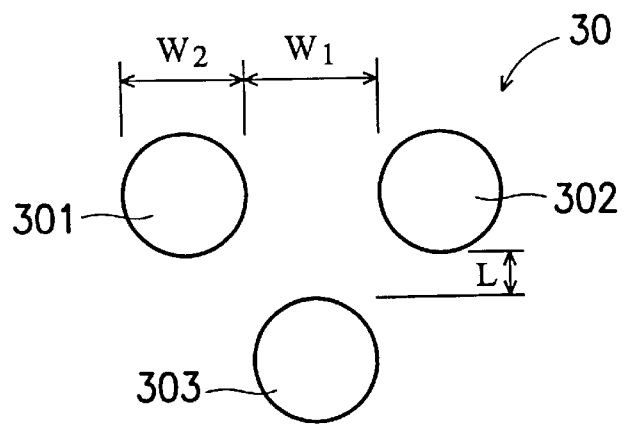

According to the profile-design rule, when the contact area of the metal bump 30 can be kept at a receivable range to maintain the demanded conductivity, the metal bumps 301, 302, 303 can present various profiles, such as the irregular profile shown in FIG. 3A, the elliptical profile shown in FIG. 3B, or the circular profile shown in FIG. 3C. The first advantage is that the smallest distance $P_1$ between the curved face 32 of the first metal bump 301 and the first curved face 36 of the third metal bump 303 is increased to avoid an electrical connection between the first metal bump 301 and the third metal bump 303. Similarly, the smallest distance $P_1$ is increased to avoid an electrical connection between the second metal bump 302 and the third metal bump 303.

Figure 3D:
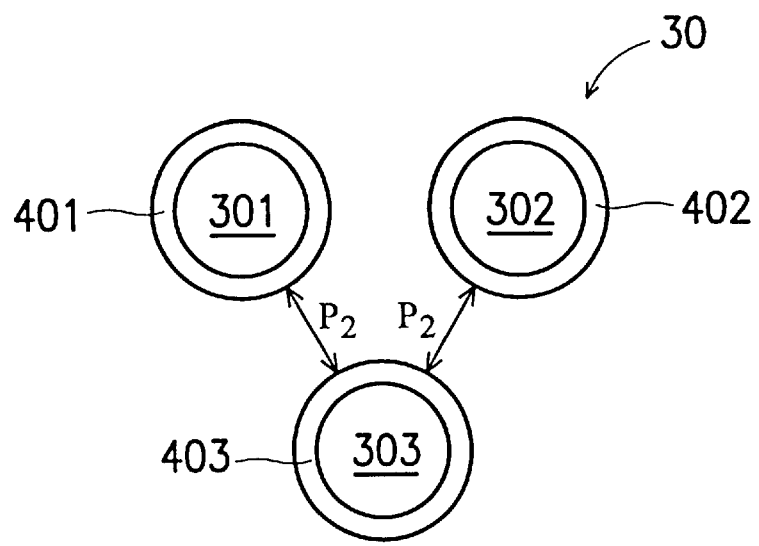

As shown in FIG. 3D, a top view of the metal bumps 30 corresponding in position to bonding pads 40, the bonding pads 40 on a glass substrate present a circular profile depending on the circular profile of the metal bumps 30. Within the smallest distance $P_2$ between the first bonding pad 401 and the third bonding pad 403, the probable contact region is the circumference of the first metal bump 301 and the circumference of the third bonding pad 403, as a point of tangency. Thus, the second advantage is that an electrical short is not likely to be caused between the first metal bump 301 and the third bonding pad 403 if the chip is inaccurately aligned to the glass substrate. This can improve the tolerance limitation of alignment error in COG technique. Similarly, an electrical short is not easily caused between the second metal bump 302 and the third bonding pad 403.

Figure 3E:
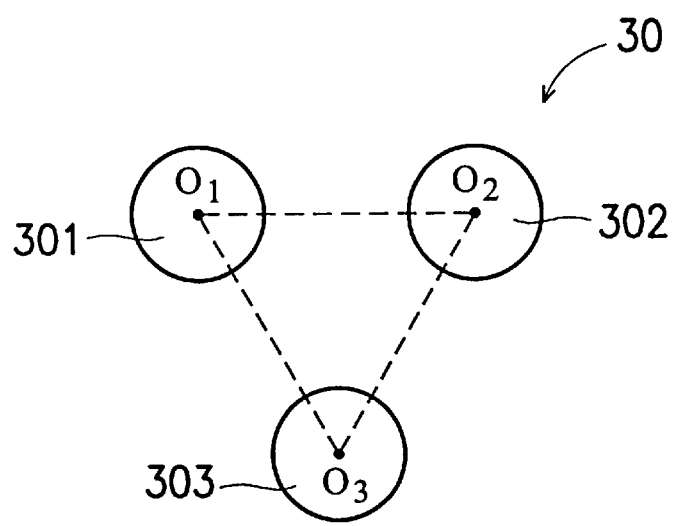

In accordance with the metal bumps 30 presenting a circular profile, there are other advantages. The fabricating method for the circular profile is simpler and improves the quality of the metal bumps 30. Also, since gold bumps create the problem of an anisotropical variation at the right-angle point, the circular profile solves this problem. Furthermore, as shown in FIG. 3E, the three centers $O_1$, $O_2$, $O_3$ of the three metal bumps 301, 302, 303 can be arranged as an equilateral triangle to reduce the transverse distance between adjacent metal bumps 301, 302 and the lengthwise distance between adjacent rows to a limitation. This can increase layout density of the metal bumps 30 and the size of the chip can be smaller to increase the amount of chips fabricated on a wafer.

Figure 3F:
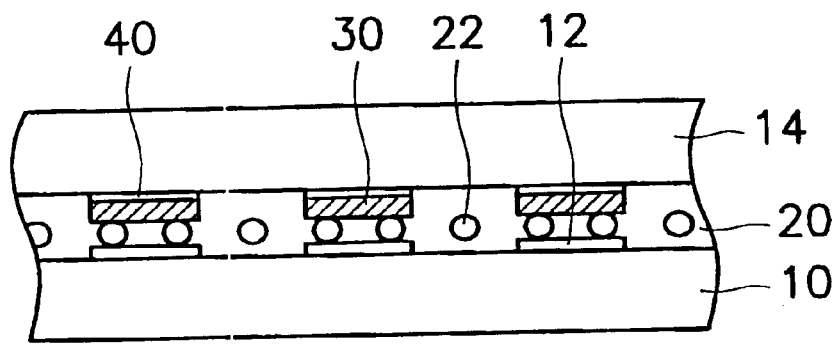
FIG. 3F is a schematic cross-sectional diagram of a method of connecting the chip to the glass substrate according to the first embodiment of the present invention.

FIG. 3F is a schematic cross-sectional diagram of a method connecting the chip and the glass substrate according to the first embodiment of the present invention. A glass substrate 10 of an LCD module comprises a first area on which an array of thin film transistors (TFTs) are disposed, a second area on which data IC chips or scan IC chips 14 are disposed, and a plurality of bonding pads 12 formed on the second areas. The chip 14 has a plurality of metal pads 40 and a plurality of metal bumps 30, wherein each metal bump 30 is patterned on each metal pad 40 and corresponds in position to each bonding pad 12. Also, an ACF 20 is attached to the surface of the glass substrate 10 to cover the bonding pad 12. Then, the surface of the chip 14 is downwardly placed on the predetermined area of the glass substrate 10, wherein each metal bump 30 corresponds to each bonding pad 12 of the glass substrate 10. By means of the adhesion of the ACF 20 and the downwardly exerted pressure, the chip 14 is tightly attached to the glass substrate 10. Next, a thermal process is performed to cure the ACF 20. The conductive particles 22 sandwiched between the top of the metal bump 30 and the surface of the bonding pad 12 serve as an electrically connecting bridge.

[Second Embodiment]

Please refer to FIGS. 4A to 4E, which are top views of metal bumps 50 according to the second embodiment of the present invention. A plurality of metal bumps 50 is arranged in two adjacent rows. In each row, each metal bump 50 with a transverse width $W_2$ is spaced out a transverse distance $W_1$ apart from each other, and the tops of the metal bumps 50 are leveled off. Notice that the transverse distance $W_1$ is equal to the transverse width $W_2$, and a lengthwise distance L between the two adjacent rows is smaller than the transverse distance $W_1$. In a first row, a first metal bump 501 and a second metal bump 502 are adjacent and separated by distance $W_1$. In a second row, a third metal bump 503 is disposed between the first metal bump 501 and the second bump 502. Therefore, the connection between the three centers of the three metal bumps 501, 502, 503 respectively forms a triangle.

Figure 4F:
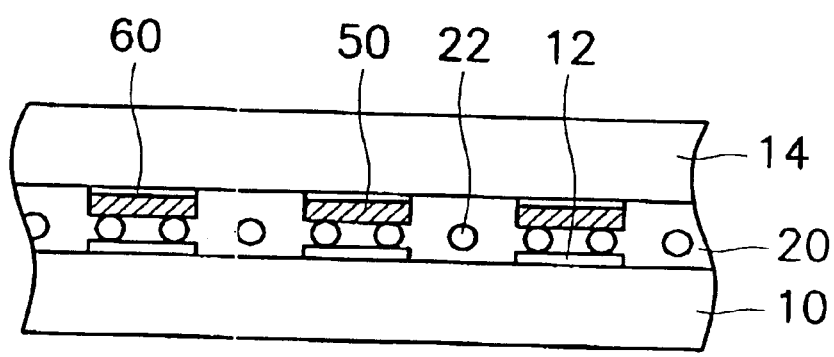
FIG. 4F is a schematic cross-sectional diagram of a method of connecting the chip to the glass substrate according to the second embodiment of the present invention.
Figure 4A:
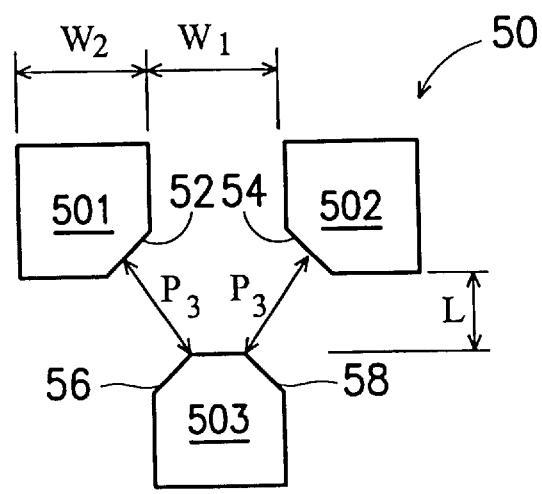
FIGS. 4A to 4E are top views of metal bumps according to the second embodiment of the present invention.

As shown in FIG. 4A, the first metal bump 501 has at least one faceted face 52, the second metal bump 502 has at least one faceted face 54, and the third metal bump 503 at least has a first faceted face 56 and a second faceted face 58. The first faceted face 56 of the third metal bump 503 is adjacent to the faceted face 52 of the first metal bump 501, and the second faceted face 58 of the third metal bump 503 is adjacent to the faceted face 54 of the second metal bump 502.

Figure 4B:
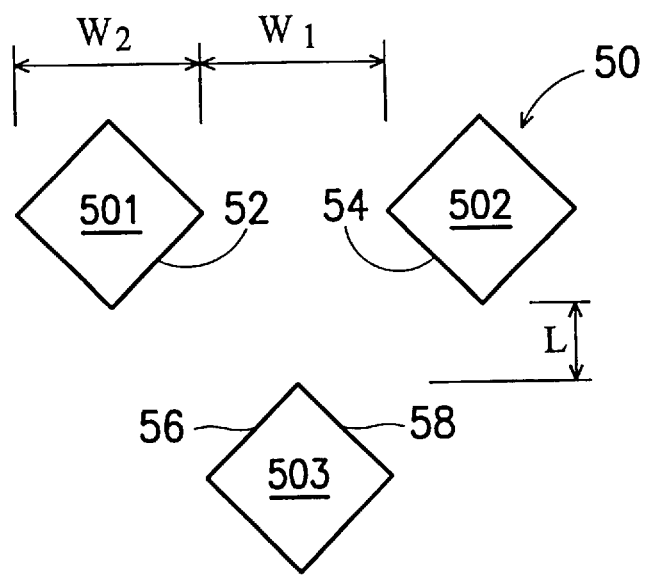
Figure 4C:
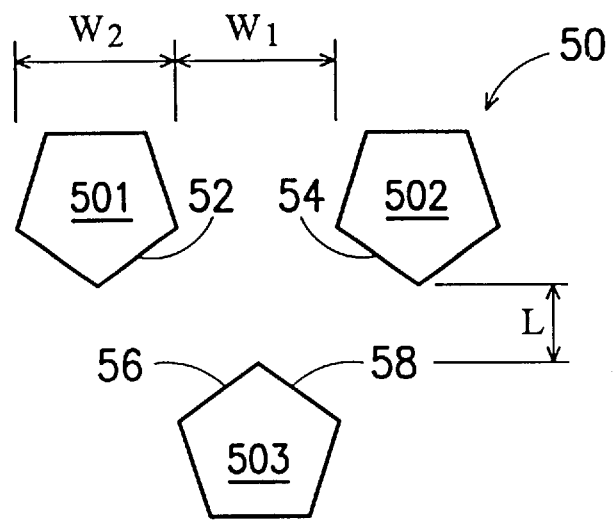
Figure 4D:
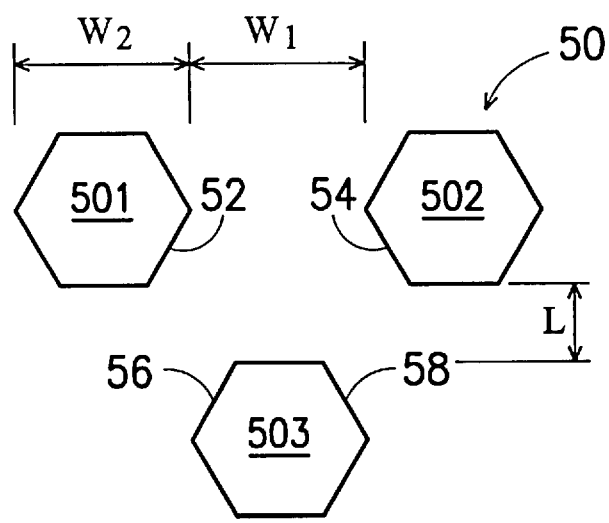
Figure 4E:
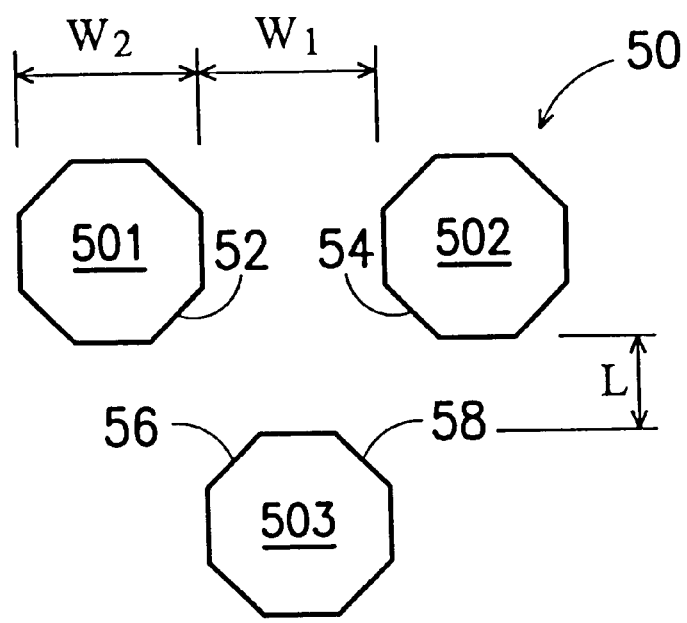

According to the profile-design rule, when the contact area of the metal bump 50 can be kept at a receivable range to maintain the demanded conductivity, the metal bumps 501, 502, 503 can present various profiles, such as the irregular profile shown in FIG. 4A, the rhombus profile shown in FIG. 4B, the equilateral pentagon profile shown in FIG. 4C, the equilateral hexagon profile shown in FIG. 4D, or the equilateral octagon profile shown in FIG. 4E. The first advantage is that the smallest distance $P_3$ between the faceted face 52 of the first metal bump 501 and the first faceted face 56 of the third metal bump 503 is increased to avoid an electrical connection between the first metal bump 501 and the third metal bump 503. Similarly, the smallest distance $P_3$ is increased to avoid a electrical connection between the second metal bump 502 and the third metal bump 503. The second advantage is that the diagonal distance between the bonding pads is also reduced, hence an electrical short is not easily caused between the metal bump 50 and the bonding pad if the chip is inaccurately aligned to the glass substrate. This can improve the tolerance limitation of alignment error in COG technique.

FIG. 4F is a schematic cross-sectional diagram of a method of connecting the chip to the glass substrate according to the second embodiment of the present invention. A glass substrate 10 of an LCD module comprises a first area on which an array of thin film transistors (TFTs) are disposed, a second area on which data IC chips or scan IC chips 14 are disposed, and a plurality of bonding pads 12 formed on the second areas. The chip 14 has a plurality of metal pads 60 and a plurality of metal bumps 50, wherein each metal bump 50 is patterned on each metal pad 60 and corresponds in position to each bonding pad 12. Also, an ACF 20 is attached to the surface of the glass substrate 10 to cover the bonding pad 12. Then, the surface of the chip 14 is downwardly placed on the predetermined area of the glass substrate 10, wherein each metal bump 50 corresponds to each bonding pad 12 of the glass substrate 10. By means of the adhesion of the ACF 20 and the downwardly exerted pressure, the chip 14 is tightly attached to the glass substrate 10. Next, a thermal process is performed to cure the ACF 20. The conductive particles 22 sandwiched between the top of the metal bump 50 and the surface of the bonding pad 12 serve as an electrically connecting bridge.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A plurality of metal bumps for connecting a nonconducting substrate with a plurality of bonding pads and a chip with a plurality of metal pads corresponding in position to the bonding pads, the plurality of metal bumps being respectively disposed between the metal pads and the bonding pads and comprising:

at least a first metal bump having at least one curved face and formed on a first metal pad of the chip;

at least a second metal bump having at least one curved face and formed on a second metal pad of the chip; and at least a third metal bump having at least a first curved face and a second curved face and formed on a third metal pad of the chip;

wherein the three centers of the first metal bump, the second metal bump and the third metal bump are arranged as a triangle, the first curved face of the third metal bump is adjacent to the curved face of the first metal bump, and the second curved face of the third metal bump is adjacent to the curved face of the second metal bump and the first bump, the second bump and the third bump are free from electrical connection to each other.

2. The plurality of metal bumps as claimed in claim 1, wherein each metal bump is a cylinder.

3. The plurality of metal bumps as claimed in claim 1, wherein the three centers of the first metal bump, the second metal bumps and the third metal bump are arranged as a equilateral triangle.

4. The plurality of metal bumps as claimed in claim 1, wherein an anisotropic conductive film (ACF) is disposed between the nonconducting substrate and the chip to fill the space between adjacent metal bumps.

5. A plurality of metal bumps for connecting a nonconducting substrate with a plurality of bonding pads and a chip with a plurality of metal pads corresponding in position to the bonding pads, the plurality of metal bumps being respectively disposed between the metal pads and the bonding pads and comprising:

at least a first metal bump having at least one faceted face and formed on a first metal pad of the chip;

at least a second metal bump having at least one faceted face and formed of a second metal pad of the chip; and at least a third metal bump having at least a first faceted face and a second faceted face and formed on a third metal pad of the chip;

wherein the three centers of the first metal bump, the second metal bump and the third metal bump are arranged as a triangle, the first faceted face of the third metal bump is adjacent to the faceted face of the first metal bump to provide a shortest distance between the third metal bump and the first metal bump, and the second faceted face of the third metal bump is adjacent to the faceted face of the second metal bump to provide a shortest distance between the third metal bump and the second metal bump and the first bump, the second bump and the third bump are free from electrical connection to each other.

6. The plurality of metal bumps as claimed in claim 5, wherein each metal bump is a polygonal bump.

7. The plurality of metal bumps as claimed in claim 6, wherein each metal bump is a pentagonal bump.

8. The plurality of metal bumps as claimed in claim 6, wherein each metal bump is a hexagonal bump.

9. The plurality of metal bumps as claimed in claim 6, wherein each metal bump is a octagonal bump.

10. The plurality of metal bumps as claimed in claim 5, wherein an anisotropic conductive film (ACF) is disposed between the nonconducting substrate and the chip to fill the space between adjacent metal bumps.

* * * * *